United States Patent
Turner et al.

(10) Patent No.: US 7,242,515 B2
(45) Date of Patent: Jul. 10, 2007

(54) STRUCTURE AND METHOD FOR REDUCING THERMAL STRESSES ON A TORSIONAL HINGED DEVICE

(75) Inventors: Arthur Monroe Turner, Allen, TX (US); John W. Orcutt, Richardson, TX (US); Carter Bruce Simpson, Celina, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/232,604

(22) Filed: Sep. 22, 2005

(65) Prior Publication Data

US 2006/0132898 A1  Jun. 22, 2006

Related U.S. Application Data

(60) Provisional application No. 60/638,483, filed on Dec. 22, 2004.

(51) Int. Cl.
*G02F 1/00* (2006.01)

(52) U.S. Cl. .................................................. 359/321

(58) Field of Classification Search ................ 359/291, 359/290, 292, 295, 298, 223, 224, 320, 321
See application file for complete search history.

(56) References Cited

U.S. PATENT DOCUMENTS

| 6,563,106 | B1 * | 5/2003 | Bowers et al. | 250/216 |
| 6,885,493 | B2 * | 4/2005 | Ljungblad et al. | 359/290 |
| 6,894,823 | B2 * | 5/2005 | Taylor et al. | 359/291 |
| 6,964,196 | B2 * | 11/2005 | Turner et al. | 73/580 |
| 7,034,982 | B2 * | 4/2006 | Doan | 359/290 |
| 7,092,143 | B2 * | 8/2006 | Heureux | 359/291 |

* cited by examiner

*Primary Examiner*—David Spector
*Assistant Examiner*—Tuyen Tra
(74) *Attorney, Agent, or Firm*—William B Kempler; W. James Brady, III; Frederick J. Telecky, Jr.

(57) ABSTRACT

Method and structure for mounting a torsional hinged device, such as a mirror, having a first TCE (thermal coefficient of expansion) on a substrate having a second TCE different than said first TCE. The structure comprising a plurality of compliant support posts between the substrate and the torsional hinged device that deform when the contraction and/or expansion of the torsional hinged device is different than the corresponding contraction and expansion of the substrate.

14 Claims, 3 Drawing Sheets

STRUCTURE AND METHOD FOR REDUCING THERMAL STRESSES ON A TORSIONAL HINGED DEVICE

This application claims the benefit of U.S. Provisional Application No. 60/638,483, filed on Dec. 22, 2004, entitled Method Of Reducing Thermal Stresses On A MEMS Mirror, which application is hereby incorporated herein by reference.

TECHNICAL FIELD

The present invention relates to torsionally hinged devices, such as mirrors, and more particularly to reducing thermal stresses on the devices even when mounted to a substrate having a significantly different TCE (thermal coefficient of expansion).

BACKGROUND

In recent years, MEMS (Micro Electro Mechanical Systems) torsional hinged mirror structures have found significant application in telecommunication and free space optic systems such as optical switches and fiber optic replacement for broadband communications. Strides have also been made as replacements for spinning polygon mirrors used as the engine for high speed printers and some types of display systems. Such torsional hinged mirror structures have certain advantages over the systems they replace including high bandwidth, lower cost, and smaller volume. However, every new technology has its own set of problems and using torsional hinged mirrors in precision applications is no exception. One problem experienced by torsional hinged devices, such as mirrors, is excessive compressive loads or stresses on the torsional hinges due to the combination of temperature changes and significant differences in the TCE of the devices, and the TCE of the structure that supports the device. For example, the device is likely to be silicon, which has a very low TCE of approximately $3 \times 10^{-6}/°$ C. On the other hand, traditional substrate materials used for supporting devices, such as mirrors, have somewhat higher TCEs of approximately 6 to $20 \times 10^{-6}/°$ C. The silicon devices are typically assembled or bonded to the substrate with an adhesive, which is cured at approximately 125° C. However, when the silicon substrate assembly cools to the minimum specified temperature, the substrate shrinks substantially more than the silicon device, causing the device to be put in significant compressive loading. Sometimes, the low temperature exposure causes the hinges of the device to fail because of compressive buckling.

Previous efforts to solve these problems used ceramic substrates, which have a very low TCE somewhat comparable to the TCE of the silicon device itself. However, these ceramic substrates are expensive compared with other types of substrates and distract from the otherwise cost advantages of torsional hinged devices. Therefore, it will be appreciated that a method of controlling the TCE low temperature compressive loading and hinged device buckling while using inexpensive type substrates would be advantageous.

SUMMARY OF THE INVENTION

These and other problems are generally solved or circumvented and technical advantages are generally achieved by embodiments of the present invention, which provide a structure and method of mounting torsional hinged devices, such as a MEMS (micro electro mechanical systems) mirror, made out of material, (such as silicon) having a low TCE, to a substrate with a much higher TCE, such that excessive compressive stresses on the torsional hinge of the device can be avoided even over a rather wide range of temperatures.

The structure and methods of the invention comprise providing an inexpensive substrate having a first TCE that may be significantly higher than the TCE of silicon or ceramic. A plurality of compliant support posts made of a material such as liquid crystal polymer, filled nylon polymer, or other molded polymers are provided to support the torsional hinged device. Each of the support posts will include a bottom mounting surface and a top mounting surface, and typically the bottom mounting surface is bonded to the substrate having a high TCE. The compliant support posts are designed so that their combined properties of height, cross section, and mechanical stiffness provide mechanical compliance sufficient to separate the torsional hinged device from the substrate and reduce any stress applied to the silicon so as to avoid performance degradation of the mechanical functions of the torsional hinged devices. The design of the compliant support posts takes into account the cure temperature of the adhesive at the interfaces, the operating temperature range of the device and the hinge stress level, which causes performance degradation such as buckling. In addition, for mirror devices, the mirror stress level, which causes static mirror deformation and loss of flatness is also considered. The end result is that the compliant support posts will separate the device from the substrate by a significantly larger distance than the adhesive and spacer used in the prior art to mount the devices to a substrate.

According to one embodiment, there will be four support posts arranged so that one support post is at each corner of the device, which typically has a rectangular shape. However, it will be appreciated that the number of support pads may vary depending on the support requirements of the device. For example, as few as two and more than four posts could be used. Further, in one embodiment, the support posts are connected together by a perimeter frame member to form a unitary structure. The combination support posts and perimeter frame member provides advantages over individual support posts in that the difficulty in assembly of the structure is significantly reduced. The torsional hinged device is then mounted to the top mounting surfaces of the support post and, as was discussed above, will likely have a second TCE that is significantly different than the TCE of the substrate. Typically, the TCE of the torsional hinged device will be significantly lower than that of the substrate. Thus, the compliant and tall support post deforms to alleviate stresses that would otherwise be caused by the differences in contraction and/or expansion of the silicon torsional hinged device and the substrate. It should also be appreciated that the novel features of the present invention are equally applicable to a single axis torsional hinged device structure or a dual axis torsional hinged structure.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 3A:
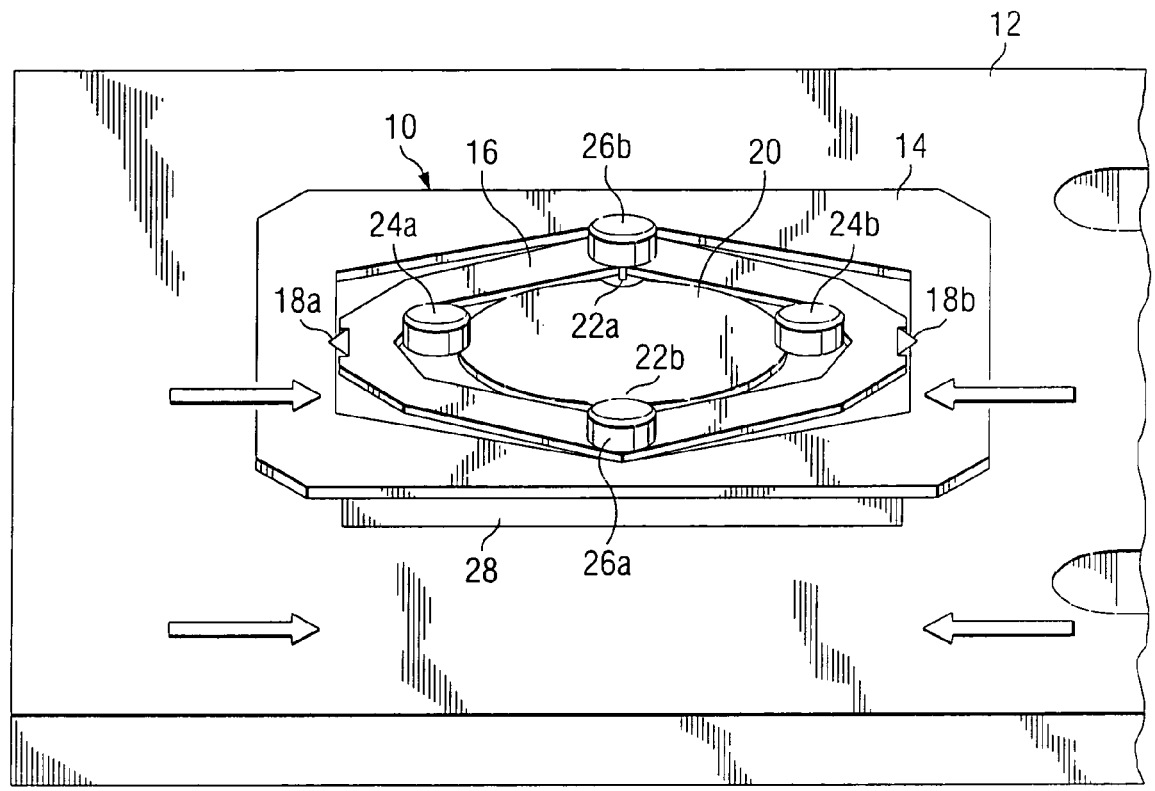
FIGS. 3A and 3B show a prior art method of mounting a torsional hinged mirror to a substrate, wherein the mirror and the substrate have different TCEs.
Figure 3B:
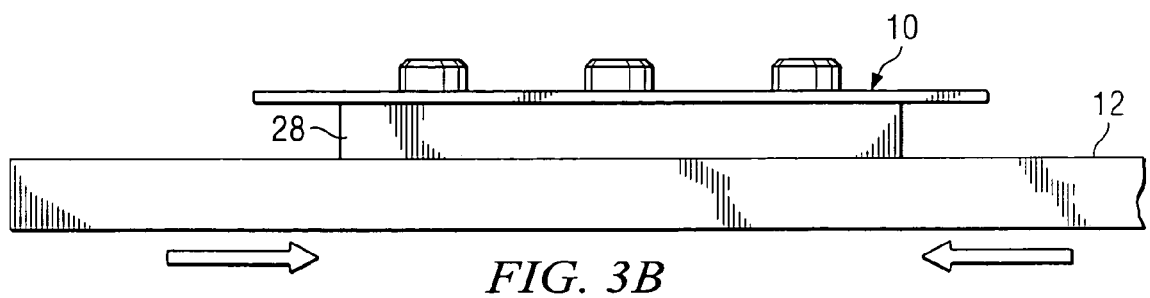

Referring now to prior art FIGS. 3A and 3B, there is shown a dual axis torsional hinged device structure 10 mounted to a substrate 12. It will be appreciated that although the figures illustrate mirror structures, other torsional hinged devices including, but not limited to, diffraction gratings and refractive, reflective and diffractive lens may also benefit from the teachings of the present invention. In the illustrative embodiment, the torsional hinged structure is a MEMS device such as a dual axis mirror having a support frame 14, which is connected to a Gimbals portion 16 by a pair of torsional hinges 18a and 18b. Similarly, the operating surface of the device such as the reflecting or mirror surface 20 is connected to the Gimbals portion by a second pair of torsional hinges 22a and 22b. Torsional hinges 22a and 22b are mounted orthogonally or perpendicular with respect to torsional hinges 18a and 18b. In the embodiment shown, there is also included a first pair of permanent magnets 24a and 24b and a second pair of permanent magnets 26a and 26b. As is well known by those skilled in the art, the permanent magnets interact with electro magnet coils for driving or oscillating the device structure about the torsional hinges and will not be discussed further.

In the prior art embodiment shown in FIGS. 3A and 3B, the device 10 is mounted to the substrate 12 by bonding the substrate and the device to a spacer 28, which may be made of silicon.

As was discussed above, this technique for mounting the device 10 to substrate 12 may result in substantial stresses that are created on the hinges with changes in temperature. For example, the substrate will typically have a TCE of between 6 to $12 \times 10^{-6}/°$ C., whereas the device 10, which is likely made of silicon, will typically have a very low thermal coefficient of expansion of approximately $3 \times 10^{-6}/°$ C. Thus, it is seen that the thermal coefficient of expansion for the substrate is 2 to 4 times the TCE of the device. Since the adhesive used to bond the device 10 to the substrate 12 by means of the spacer 28 is often cured at temperatures of above 125° C., it will be appreciated that such differences in the TCE between the device and the substrate can produce stresses, which are transmitted from the substrate into the device by means of the spacer. Although, prior art FIGS. 3A and 3B illustrate a dual axis torsional hinged mirror, it will be appreciated by those skilled in the art, that the teachings of the present invention are applicable to both dual axis and single axis torsional hinged devices.

Figure 1A:
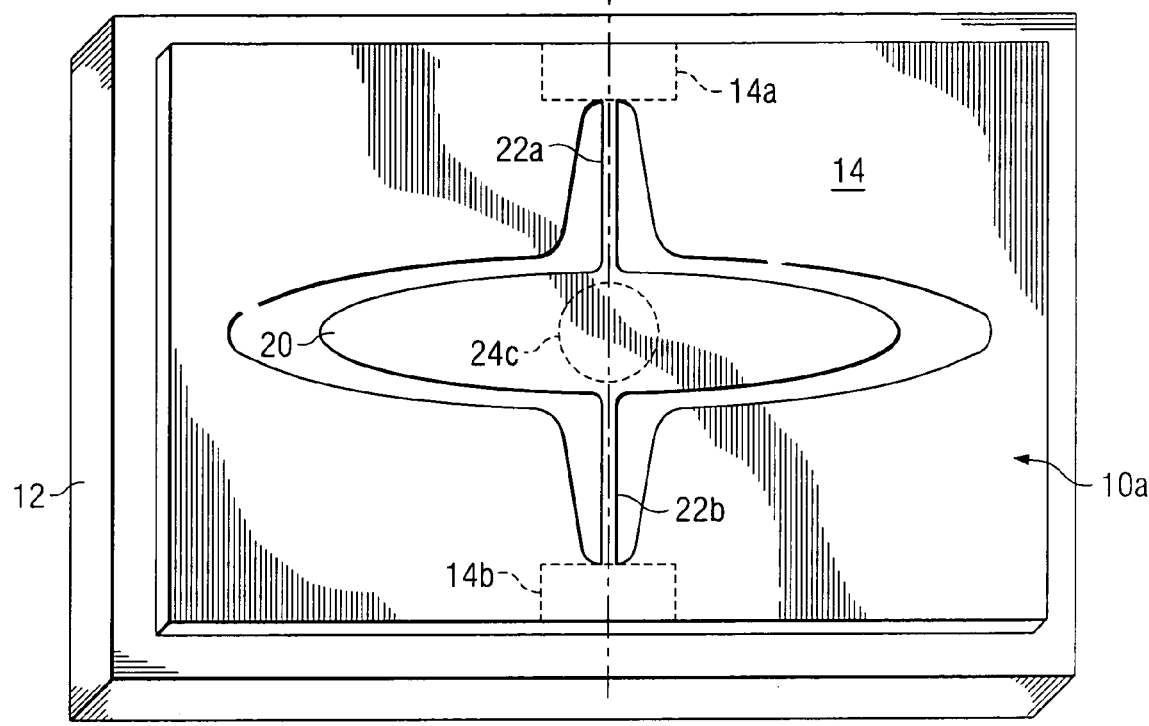
FIGS. 1A and 1B illustrate a single torsional hinged mirror in an unstressed and a stressed condition respectively, wherein the stress is due to temperature changes.
Figure 1B:
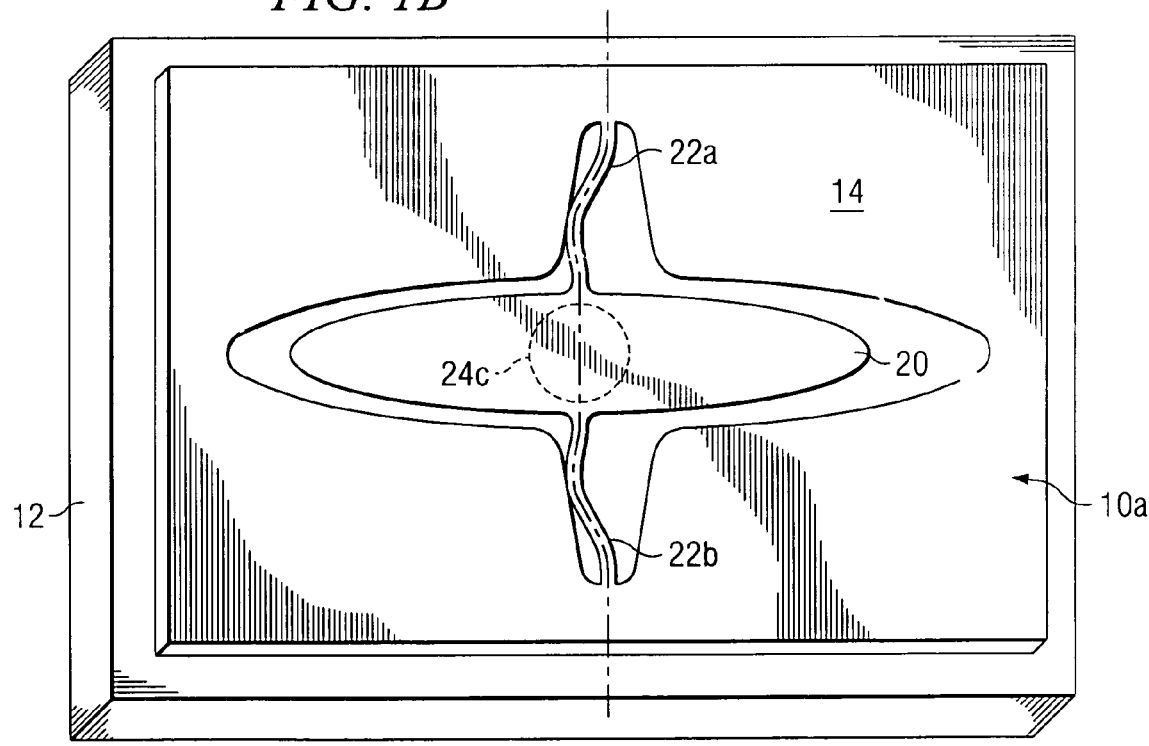

Therefore, for ease of illustration, FIG. 1A shows a single axis mirror device 10a in an unstressed condition. FIG. 1B illustrates the same single axis structure in a destructive compressive stressed condition. As shown, device 10a includes a frame member 14 and an operating surface such as reflecting or mirror surface 20 supported by a single pair of torsional hinges 22a and 22b. There is also included a single permanent magnet 24c for oscillating the operating surface. As indicated by dashed lines anchor pads 14a and 14b may be used to support device 10a rather than a support frame 14.

Figure 2A:
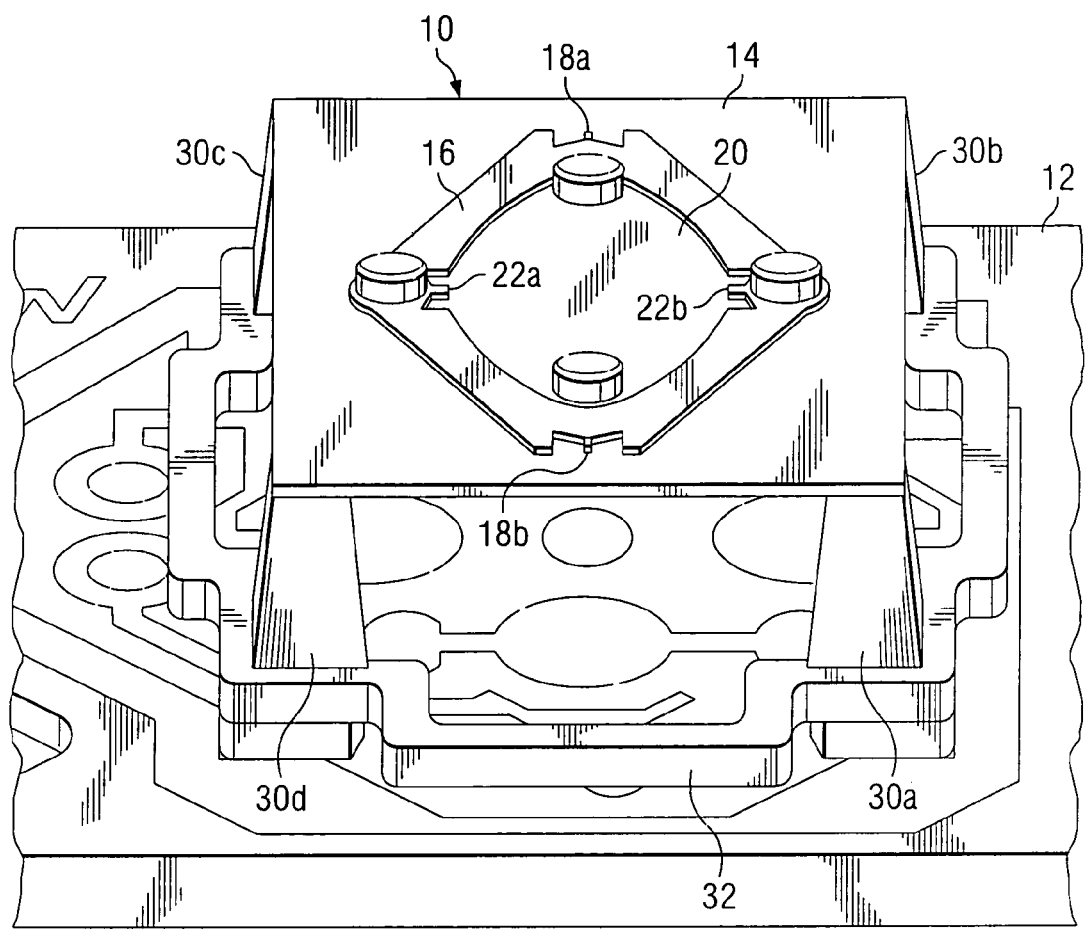
FIGS. 2A and 2B illustrate a perspective view and a side view respectively of an embodiment of the present invention.
Figure 2B:
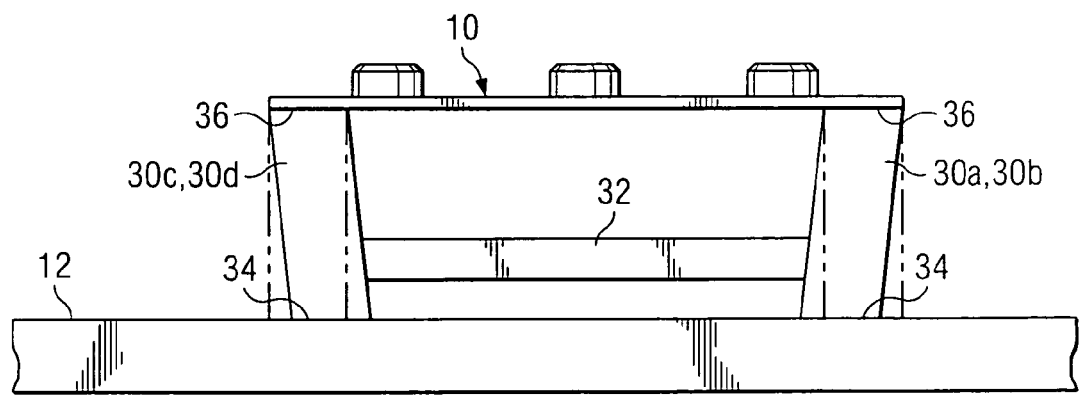

Referring now to FIGS. 2A and 2B, there is shown a perspective and side view of the method and structures of the present invention for mounting a dual axis device (similar to the type discussed with respect to prior art FIGS. 3A and 3B) to a substrate such that the device hinges are not unduly stressed even with significant temperature changes. Those portions of the device that operate the same and are similar to the single axis structure of FIG. 1A and the prior art structure as discussed with respect to FIGS. 3A and 3B, carry the same reference numbers. Therefore as shown, there is included a device 10, such as for example a mirror, and a support substrate 12. The device 10 includes a frame member 14, which supports a Gimbals member 16 by a pair of torsional hinges 18a and 18b. Also in a similar manner, there is an operating surface 20, such as a reflecting surface supported by Gimbals member 16 by means of a second pair of torsional hinges 22a and 22b. Torsional hinges 22a and 22b are mounted or arranged orthogonal with respect to torsional hinges 18a and 18b. However, unlike the spacers 28 discussed in FIGS. 1A and 1B for mounting the device 10 to the substrate 12, the present invention comprises a plurality of support posts 30a, 30b, 30c, and 30d each of which has a bottom mounting surface 34 that is bonded to substrate 12, and a top mounting surface 36 to which is bonded the device 10. As shown, the support posts 30a–30d are made of a compliant material, such as for example liquid crystal polymer, filled nylon polymer, or other molded polymers. In addition, it will be appreciated that the support posts 30a and 30b have a substantial length that is much greater than the thickness of the spacer 28, discussed with respect to the prior art FIGS. 3A and 3B. Also as shown in FIGS. 2A and 2B, there is included a perimeter frame member 32 that connects the support posts 30a–30b. The perimeter frame member 32 provides more stability to the support structure and also facilitates the easy assembly of the structure. Although FIG. 2A shows a dual axis device supported by four support posts, it will be appreciated that a single axis device such as illustrated in FIG. 1A could also be supported by the four posts and perimeter frame member structure of FIG. 2A. Alternately, a single axis device having anchor pads 14a and 14b could be supported by only two support posts (not shown). It should also be appreciated that a device could have a need for more than four support posts. Therefore, although a four post support structure is likely to be the typical arrangement, it is seen that few as two support parts and more than four may be used.

Referring to side view FIG. 2B, there is illustrated an exaggerated example of the operation of the invention with respect to the arrangement of FIG. 2A. As shown and as has been discussed, the bottom mounting surface 34 is bonded to the substrate 12 and the top mounting surface 36 is bonded to the device 10. The phantom lines illustrate the support posts 30a–30d during the high temperature curing of the adhesive mounting the posts to the substrate and the device. The support posts illustrated by solid lines, on the other hand, illustrate an exaggerated example of the shape of the posts after the temperature reduction from the curing temperature. As can be seen, the posts deform to alleviate stresses that would otherwise be transmitted from the substrate into the device 10. Thus, the use of the plurality of post spacers allows a low cost fiberglass reinforced, flame retardant (FR4) support substrate to be used instead of a high cost ceramic substrate or other high cost CTE matched material. Further, the support structure of the invention avoids unacceptable hinge stress over a temperature range of between about −40° C. and 85° C., and an operating temperature range of between about −10° C. and 60° C.

As discussed, according to a preferred embodiment, there are four support posts. However, it will be appreciated that in addition to the embodiments already discussed, there may still be other arrangements. For example, two posts extending along two opposing sides could be used as well as arrangements where more than four posts are provided.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, methods and steps described in the specification. As one of ordinary skill in the art will readily appreciate from the disclosure of the present invention, processes, machines, methods, or steps, presently existing or later to be developed, that perform substantially the same function or achieve substantially the same result as the corresponding embodiments described herein may be utilized according to the present invention. Accordingly, the appended claims are intended to include within their scope such process, machines, methods, or steps.

What is claimed is:

1. A method of mounting a torsional hinged structure for use over a selected temperature range to a substrate having a different TCE (temperature coefficient of expansion) comprising the steps of:
    providing a substrate having a first TCE;
    providing a plurality of compliant support posts, each of said support posts including a bottom mounting surface, and a top mounting surface;
    bonding said bottom mounting surface of said plurality of support posts to said substrate;
    bonding a torsional hinged structure having a second TCE to said top mounting surfaces of said plurality of compliant support posts, said second TCE being different than said first TCE, wherein said complaint support posts have a third TCE different from said first or second TCE; and
    said plurality of compliant support posts deforming when the expansions and/or contractions of said torsional hinged structure are different than the corresponding expansions and/or contractions of the substrate.

2. The method of claim 1 wherein said plurality of support posts are connected together with a perimeter frame member.

3. The method of claim 2 wherein said plurality of support posts and said perimeter frame members are formed as a unitary structure.

4. The method of claim 1 wherein said plurality of support posts are made from a material selected from the group consisting of liquid crystal polymer, filled nylon polymer, or other molded polymers.

5. The method of claim 1 wherein said step of providing a plurality of complaint support posts comprises providing four support posts.

6. The method of claim 1 wherein step of providing a plurality of compliant support posts comprises providing two support posts.

7. The method of claim 1 wherein said first TCE is at least two times said second TCE.

8. The method of claim 1 wherein said torsional hinged structure is a MEMS (micro electro mechanical system) mirror.

9. The method of claim 8 wherein said torsional hinged structure is made of silicon.

10. The method of claim 1 wherein said torsional hinged structure is a MEMS diffractive grating.

11. The method of claim 1 wherein said torsional hinged structure is one of a refractive lens, a reflective lens, or a diffractive lens.

12. The method of claim 1 wherein said torsional hinged structure is a dual hinged mirror.

13. The method of claim 1 wherein said selected temperature range is between about −40° C. and 125° C.

14. The method of claim 1 wherein said torsional hinged structure is made of silicon.

* * * * *